United States Patent
Kwon et al.

(10) Patent No.: US 7,898,886 B2
(45) Date of Patent: Mar. 1, 2011

(54) SENSE AMPLIFIERS AND SEMICONDUCTOR DEVICES INCLUDING THE SAME

(75) Inventors: Whee-jin Kwon, Osan-si (KR); Jung-hwa Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 366 days.

(21) Appl. No.: 12/068,983

(22) Filed: Feb. 14, 2008

(65) Prior Publication Data
US 2008/0192535 A1 Aug. 14, 2008

(30) Foreign Application Priority Data
Feb. 14, 2007 (KR) .................. 10-2007-0015227

(51) Int. Cl.
G11C 7/02 (2006.01)
(52) U.S. Cl. .................. 365/207; 365/205; 365/214
(58) Field of Classification Search .................. 365/207, 365/205, 214
See application file for complete search history.

(56) References Cited

U.S. PATENT DOCUMENTS

| | | | |
|---|---|---|---|
| 6,661,722 B2 * | 12/2003 | Lee et al. ..................... | 365/205 |
| 6,747,320 B2 | 6/2004 | Nakabayashi | |
| 6,762,953 B2 | 7/2004 | Tanizaki et al. | |
| 7,660,141 B2 * | 2/2010 | Chang ......................... | 365/63 |
| 2005/0122769 A1 | 6/2005 | Miyatake et al. | |
| 2006/0256625 A1 * | 11/2006 | Kajitani et al. ......... | 365/189.01 |
| 2008/0080282 A1 * | 4/2008 | Chang ......................... | 365/205 |
| 2009/0310432 A1 * | 12/2009 | Yang et al. ................. | 365/207 |

FOREIGN PATENT DOCUMENTS

| | | |
|---|---|---|
| JP | 20000077628 | 3/2000 |
| JP | 2003-168782 | 6/2003 |
| JP | 2004-164766 | 10/2004 |
| JP | 2005-166170 | 6/2005 |
| KR | 10-1996-0008837 | 3/1996 |
| KR | 10-2002-0085952 A | 11/2002 |
| KR | 10-2003-0001829 A | 1/2003 |
| KR | 10-2003-0056465 A | 7/2003 |
| KR | 10-2005-0043093 A | 5/2005 |
| KR | 10-2005-0064284 A | 6/2005 |
| KR | 10-2005-0103844 A | 11/2005 |
| KR | 1020060041351 | 5/2006 |

OTHER PUBLICATIONS

Korean Notice of Allowance, (dated Apr. 30, 2008) for counterpart Korean Patent Application No. 10-2007-0015227, is provided for the purposes of certification under 37 C.F.R. § 1.97(e) and 1.704(d).

* cited by examiner

Primary Examiner—Tuan T. Nguyen
(74) Attorney, Agent, or Firm—Harness, Dickey & Pierce

(57) ABSTRACT

A sense amplifier includes a first transistor having a gate electrode electrically connected to a bit line and a first electrode electrically connected to a complementary bit line. A second transistor has a gate electrode electrically connected to the complementary bit line and a first electrode electrically connected to the bit line. An equalizing transistor is disposed between the gate electrode of the first transistor and the gate electrode of the second transistor. The first electrode of the first transistor and a first electrode of the equalizing transistor are electrically connected to each other, and the first electrode of the second transistor and a second electrode of the equalizing transistor are electrically connected to each other.

25 Claims, 6 Drawing Sheets

US 7,898,886 B2

SENSE AMPLIFIERS AND SEMICONDUCTOR DEVICES INCLUDING THE SAME

PRIORITY STATEMENT

This non-provisional patent application claims priority under 35 U.S.C. §119 to Korean Patent Application No. 10-2007-0015227 filed on Feb. 14, 2007, in the Korean Intellectual Property Office, the entire contents of which is incorporated herein by reference.

BACKGROUND

Description of the Related Art

In related art semiconductor devices, increased operating speeds and capacity, and decreased power consumption, size, etc., may be associated with the one another. For example, to achieve higher operating speeds, a signal swing width may be decreased thereby increasing a switching speed and shortening a signal transmission path. The decrease in signal swing width may decrease the voltage used. A shorter signal transmission path may reduce a size of the semiconductor device. Furthermore, a relatively low voltage may reduce power consumption and the reduced size may lead to increased capacity. Accordingly, if the semiconductor device is formed to have a relatively small size, the signal transmission path may be shortened, and operating speeds may be increased. In this example, the line width may also decrease, which may reduce power consumption.

FIG. 1A is a circuit diagram illustrating a related art sense amplifier of a semiconductor device. The related art sense amplifier may sense and amplify information data stored in unit cells of the memory device and transmit the information data to an external I/O circuit.

Referring to FIG. 1A, the related art sense amplifier may be divided into a sensing array SA and an equalizing array EQ. The sensing array SA may include a PMOS transistor array PSA and an NMOS transistor array NSA. The PMOS transistor array PSA may include PMOS transistors P1 and P2 electrically connected to an array internal voltage electrode $V_{intA}$. The NMOS transistor array NSA may include NMOS transistors N1 and N2 electrically connected to the PMOS transistors P1 and P2. The NMOS transistors N1 and N2 may be further connected to an array ground voltage node $V_{ssA}$. The equalizing array EQ may be electrically connected to a bit line BL and a complementary bit line BL/.

Still referring to FIG. 1, the equalizing array EQ may include an equalizing transistor $T_{EQ}$. The equalizing transistor may receive an equalizing command signal $P_{EQ}$ through a gate electrode and control the bit line BL and the complementary bit line BL/ to have the same voltage level. Each pre-charge transistor $T_{PC1}$ and $T_{PC2}$ may receive an equalizing command signal $P_{EQ}$ through a gate electrode and supply a pre-charge voltage $V_{BL}$ to the bit line BL and the complementary bit line BL/. The equalizing array EQ may also include a pre-charge voltage electrode $V_{BL}$. Because the functions and operations of the elements of the related art sense amplifier shown in FIG. 1A are well known, a detailed description thereof will be omitted for the sake of brevity.

Conventionally, at least one related art sense amplifier is required for each bit line of a related art memory device. A related art sense amplifier may increase sensitivity, operating speeds, widen power supply voltage ranges, reduce power consumption and/or reduce area.

FIG. 1B is a diagram schematically illustrating an example layout of a related art NMOS array and equalizing array in the related art sense amplifier shown in FIG. 1A.

Referring to FIG. 1B, in the NMOS array NSA and the equalizing array EQ of the sense amplifier, the bit line BL and the complementary bit line BL/ may extend in a horizontal direction. The gate electrodes of the two NMOS transistors N1 and N2 and the equalizing transistor $T_{EQ}$ may be arranged in a horizontal direction. As described above, because a relatively large number of related art sense amplifiers are required in related art memory devices, even if a size of an area occupied by the sense amplifiers is varied, the variation in the size of the area may affect the entire chip area.

SUMMARY

Example embodiments relate to layouts of semiconductor devices, for example, layouts of semiconductor devices in which gate electrodes of transistors (e.g., NMOS transistors) and equalizing transistors of sense amplifiers may be arranged in parallel and may share junction regions with each other.

Example embodiments may provide semiconductor devices capable of reducing an area occupied by a sense amplifier.

At least one example embodiment provides a semiconductor device including a plurality of sense amplifiers. Each of the plurality of sense amplifiers may include a first transistor, a second transistor and an equalizing transistor. The first transistor may have a gate electrode electrically connected to a bit line and a first electrode electrically connected to a complementary bit line. The second transistor may have a gate electrode electrically connected to the complementary bit line and a first electrode electrically connected to the bit line. The equalizing transistor may be arranged between the gate electrode of the first transistor and the gate electrode of the second transistor. The first electrode of the first transistor and a first electrode of the equalizing transistor may be electrically connected to each other, and the first electrode of the second transistor and a second electrode of the equalizing transistor may be electrically connected to each other. The first and second electrodes may be NMOS transistors.

At least one other example embodiment provides a semiconductor device including a sense amplifier circuit or unit. The sense amplifier circuit may include a plurality of unit sense amplifiers arranged such that the unit sense amplifiers are mirrored in at least one of a vertical and horizontal direction. Each of the unit sense amplifiers may include a first transistor, a second transistor and an equalizing transistor. The first transistor may have a gate electrode electrically connected to a bit line and a first electrode electrically connected to a complementary bit line. The second transistor may have a gate electrode electrically connected to the complementary bit line and a first electrode electrically connected to the bit line. The equalizing transistor may be arranged between the gate electrode of the first transistor and the gate electrode of the second transistor. A pre-charge voltage electrode may supply a pre-charge voltage to the bit line and the complementary bit line. The first electrode of the first transistor and a first electrode of the equalizing transistor may be electrically connected to each other and the first electrode of the second transistor and a second electrode of the equalizing transistor may be electrically connected to each other. The first and second transistors may be NMOS transistors.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1A:
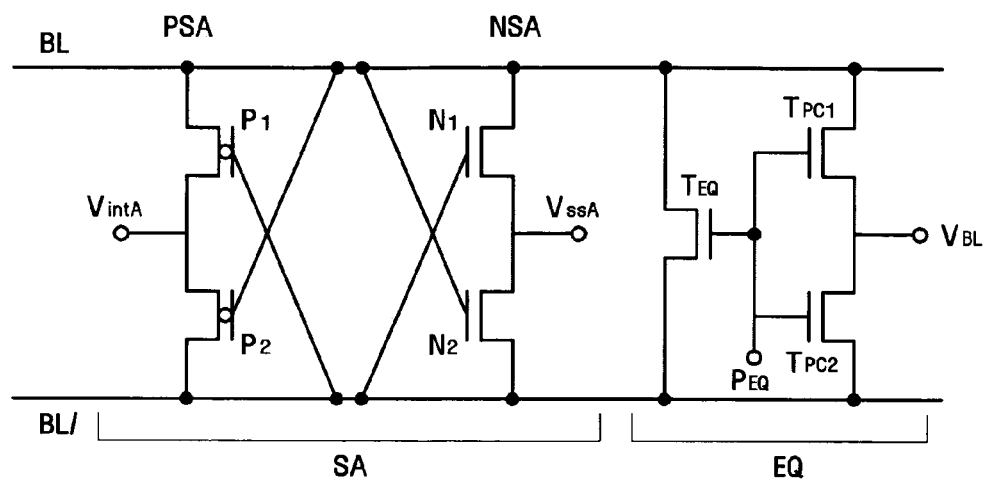
FIG. 1A is a circuit diagram of a related art sense amplifier of a related art semiconductor device.
Figure 1B:
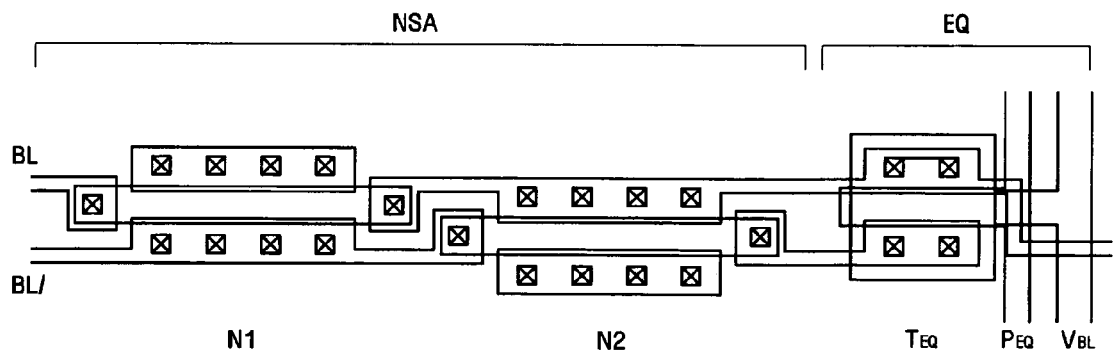
FIG. 1B is a diagram schematically illustrating an example layout of an NMOS unit and an equalizing unit of the related art sensor amplifier shown in FIG. 1A.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2A:
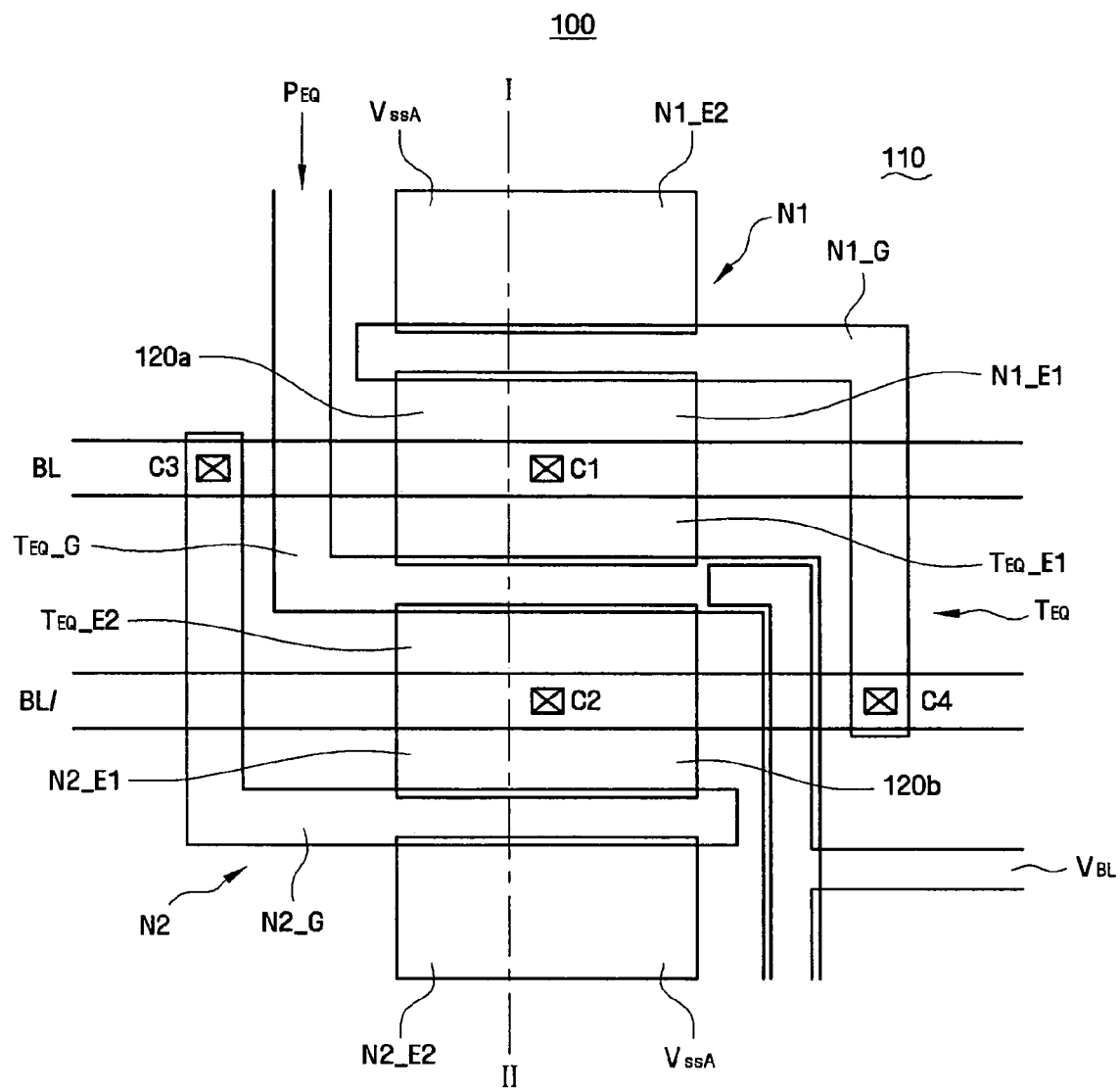
FIG. 2A is a diagram schematically illustrating an example layout of a transistor circuit and an equalizing circuit of a sense amplifier according to an example embodiment.

FIG. 2A is a diagram schematically illustrating an example layout of a transistor circuit or unit and an equalizing circuit or unit of a sense amplifier according to an example embodiment.

Referring to FIG. 2A, an example embodiment of a semiconductor device may include a sense amplifier 100. The sense amplifier 100 may include a bit line BL, a complementary bit line BL/, first and second transistors (e.g., NMOS transistors) N1 and N2, an equalizing transistor $T_{EQ}$, and a pre-charge voltage electrode $V_{BL}$, all of which may be formed on a substrate 110. In at least this example embodiment, the substrate 110 may be a wafer for semiconductor manufacture on which the sensor amplifier 100 may be disposed or formed.

The bit line BL and the complementary bit line BL/ may be data transmission lines for writing information (data) in cells (not shown) or reading the information (data) stored in the cells. Because the bit line BL and the complementary bit line BL/ are well known, a detailed description thereof will be omitted for the sake of brevity.

The first transistor N1 may have a gate electrode N1_G electrically connected to the complementary bit line BL/ and a first electrode N1_E1 electrically connected to the bit line BL. As discussed above, the first transistor N1 may be an NMOS transistor.

The second transistor N2 may have a gate electrode N2_G electrically connected to the bit line BL and a first electrode N2_E1 electrically connected to the complementary bit line BL/. As discussed above, the second transistor N2 may be an NMOS transistor.

According to at least some example embodiments, the first electrode and/or the second electrode may be a source electrode or a drain electrode of a transistor.

The second electrode of the first transistor N1_E2 and the second electrode of the second transistor N2_E2 may be electrically connected to array ground voltage electrodes $V_{ssA}$. Each of connecting portions C1, C2, C3, and C4 may be, for example, a contact or via plug.

The array ground voltage electrode $V_{ssA}$ may be a region formed by injecting impurity ions (e.g., n-type ions) into the substrate. For example, the array ground voltage electrode $V_{ssA}$ may be formed of a junction region. An example junction region will be described in more detail below.

The gate electrodes of the first and second transistors N1_G and N2_G may be formed in an L shape. The gate electrodes of the first and second transistors N1_G and N2_G may be formed in an L shape to extend the bit line BL and the complementary bit line BL/ linearly. Alternatively, the gate electrodes N1_G and N2_G may be formed to be mirrored shapes to each other with the gate electrode of the equalizing transistor $T_{EQ}$_G interposed there between.

The first electrode of the equalizing transistor $T_{EQ}$_E1 may be electrically connected to the bit line BL. The second electrode of the equalizing transistor $T_{EQ}$_E2 may be electrically connected to the complementary bit line BL/.

The equalizing transistor $T_{EQ}$ may be turned on when an equalizing command signal $P_{EQ}$ is applied to the gate electrode $T_{EQ}$_G. The equalizing transistor $T_{EQ}$ may be electrically connected (e.g., directly connected) to the bit line BL and the complementary bit line BL/ to equalize the bit line BL and the complementary bit line BL/ to have the same or substantially the same voltage level.

The gate electrode of the equalizing transistor $T_{EQ}$_G may be located between the s of the first and second transistors N1_G and N2_G when it is parallel to the gate electrodes of the first and second transistors N1_G and N2_G. The gate electrode of the equalizing transistor $T_{EQ}$_G may be formed to have the same or substantially the same shape as the L shape in which the gate electrodes of the first and second transistors N1_G and N2_G may be formed. An example shape is shown in FIG. 2A.

The sense amplifier 100 may further include an equalizing command signal line $P_{EQ}$ electrically connected to the gate electrode of the equalizing transistor $T_{EQ}$_G. For example, an equalizing command signal may be applied to the gate electrode of the equalizing transistor $T_{EQ}$_G.

A pre-charge voltage electrode $V_{BL}$ may be formed to at least partially overlap a portion of the gate electrode of the equalizing transistor $T_{EQ}$_G. The pre-charge voltage electrode $V_{BL}$ may be a conductive region formed in the substrate 110, for example, a junction region. For example, the pre-charge voltage electrode $V_{BL}$ may be a region that becomes conductive by injecting impurity ions (e.g., n-type or p-type ions) into the surface of the substrate 110. In one example, the pre-charge voltage electrode $V_{BL}$ may be a region in which n-type ions are injected. However, example embodiments are not limited thereto. For example, a separate conductive pattern may be formed to cause a current to flow into a region partially overlapping the gate electrode of the equalizing transistor $T_{EQ}$_G, which will be discussed in more detail with regard to FIG. 4.

When the equalizing command signal is applied to the gate electrode of the equalizing transistor $T_{EQ}$_G, the pre-charge voltage electrode $V_{BL}$ may supply a pre-charge voltage to the bit line BL and the complementary bit line BL/.

As shown in FIG. 2A, the pre-charge voltage electrode $V_{BL}$ and the equalizing command signal line $P_{EQ}$ may be formed to at least partially overlap each other in a first (e.g., partial) region, for example, a unit sense amplifier region. However, the pre-charge voltage electrode $V_{BL}$ and the gate electrode of the equalizing transistor $T_{EQ}$_G may not overlap each other.

When the pre-charge voltage electrode $V_{BL}$ and the equalizing command signal line $P_{EQ}$ overlap each other in a first (e.g., partial) region, the pre-charge voltage may be supplied to the bit lines BL and BL/ even though a separate transistor may not be provided.

In at least this example embodiment, the gates N1_G, N2_G, and $T_{EQ}$_G in parallel with one another may also share junction regions 120a and 120b. Each of the junction regions 120a and 120b may be formed to have a relatively large area in a region in which the gates N1_G, N2_G, and $T_{EQ}$_G are parallel to one another. The junction regions 120a and 120b may be regions that become conductive by injecting impurity ions (e.g., n-type or p-type ions) into the substrate 110. For example, the junction regions 120a and 120b may be regions formed by injecting n-type ions into the substrate 110.

As shown in FIG. 2A, for example, portions corresponding to the electrodes of the transistors N1, N2, and $T_{EQ}$ may correspond to the electrodes of the other transistors. For example, the first electrode of the first transistor N1_E1 and the first electrode of the equalizing transistor $T_{EQ}$_E1 may share the first junction region 120a with each other, and the first electrode of the second transistor N2_E1 and the second electrode of the equalizing transistor $T_{EQ}$_E2 may share the second junction region 120b with each other. The sharing described in connection with example embodiments may refer to an electrically short-circuited state without providing a separate dedicated conductive signal line.

In at least this example embodiment, each of the transistors N1 and N2, and the equalizing transistor $T_{EQ}$ may include a recessed channel array transistor (RCAT). An example embodiment of a RCAT is described in more detail below.

An example operation of the sense amplifier 100 shown in FIG. 2A will now be described in more detail.

Before the bit line BL and the complementary bit line BL/ begin a data transmission operation, the equalizing command signal $P_{EQ}$ may be applied to the gate electrode of the equalizing transistor $T_{EQ}$_G to turn on the equalizing transistor $T_{EQ}$. The bit line BL and the complementary bit line BL/ may be electrically connected to each other and may have the same or substantially the same voltage level. A pre-charge voltage may be supplied from the pre-charge voltage electrode $V_{BL}$ overlapping the gate electrode of the equalizing transistor $T_{EQ}$_G to the bit line BL and the complementary bit line BL/. The bit line BL and the complementary bit line BL/ may maintain the pre-charge voltage level. A level of the pre-charge voltage may be about half of an array internal voltage $V_{intA}$.

The equalizing transistor $T_{EQ}$ may be turned off to electrically separate the bit line BL and the complementary bit line BL/ from each other, and perform a data sensing and transmission operation. If the equalizing command signal is not applied to the gate electrode of the equalizing transistor $T_{EQ}$_G, the voltage level of the gate electrode of the equalizing transistor $T_{EQ}$_G may decrease (e.g., drop to about 0), and thus, the equalizing transistor $T_{EQ}$ may be turned off.

Figure 2B:
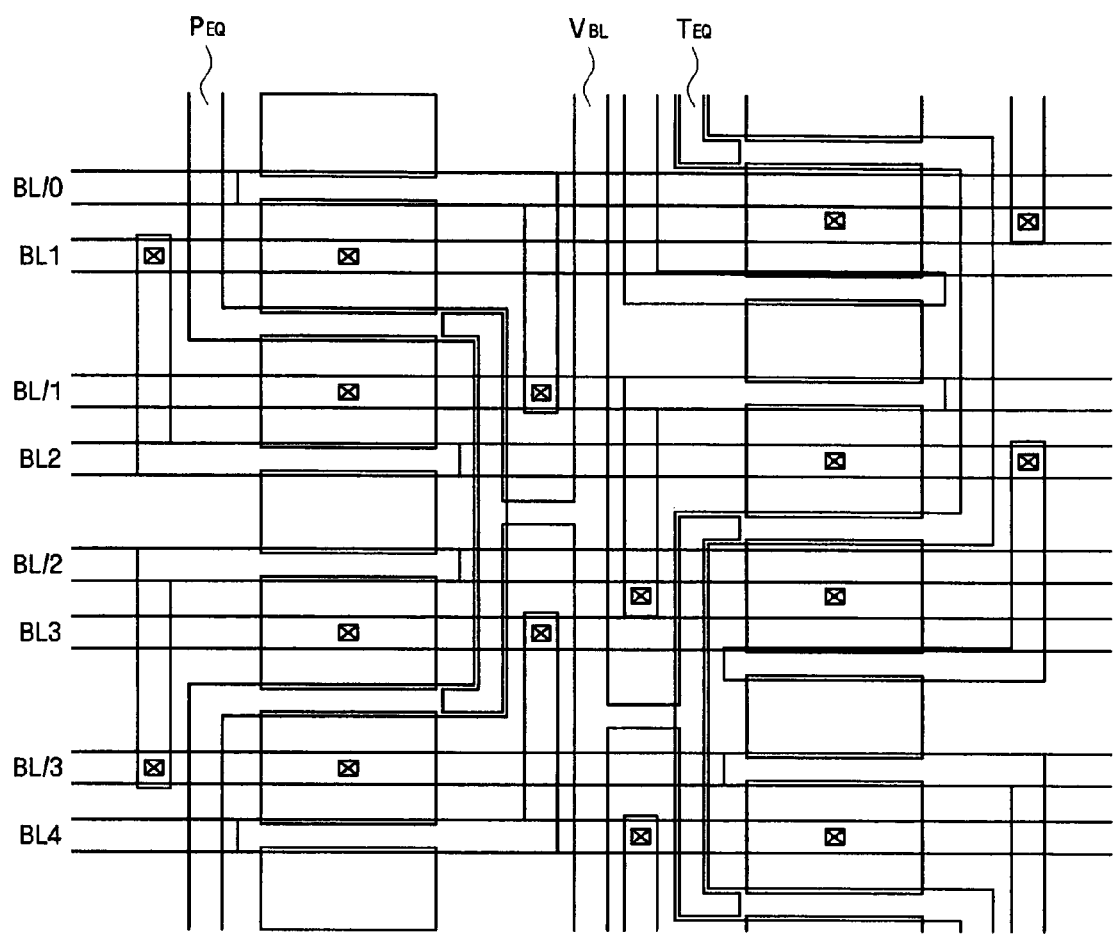
FIG. 2B is a diagram illustrating a sense amplifier unit according to an example embodiment.

FIG. 2B is a diagram illustrating an example application of an example embodiment of a sense amplifier. For example, FIG. 2B shows an example layout of transistors (e.g., NMOS transistors) and equalizing transistors with respect to a plurality of bit line and complementary bit line pairs BL0 and BL/0, BL1 and BL/1, BL2 and BL/2, BL3 and BL/3, etc.

Referring to FIG. 2B the plurality of bit line pairs BL0 and BL/0, BL1 and BL/1, BL2 and BL/2, BL3 and BL/3, etc., may be disposed in zigzags as the layouts of the transistors and the equalizing transistors simply shown in FIG. 2A may be mirrored in vertical and/or horizontal directions.

The sense amplifiers shown in FIG. 2B may perform a sensing and equalizing operation independently without the bit line pairs being affected by each other. For example, the sense amplifiers may be arranged to be bilaterally symmetrical with the pre-charge voltage electrode $V_{BL}$ interposed there between.

Figure 3A:
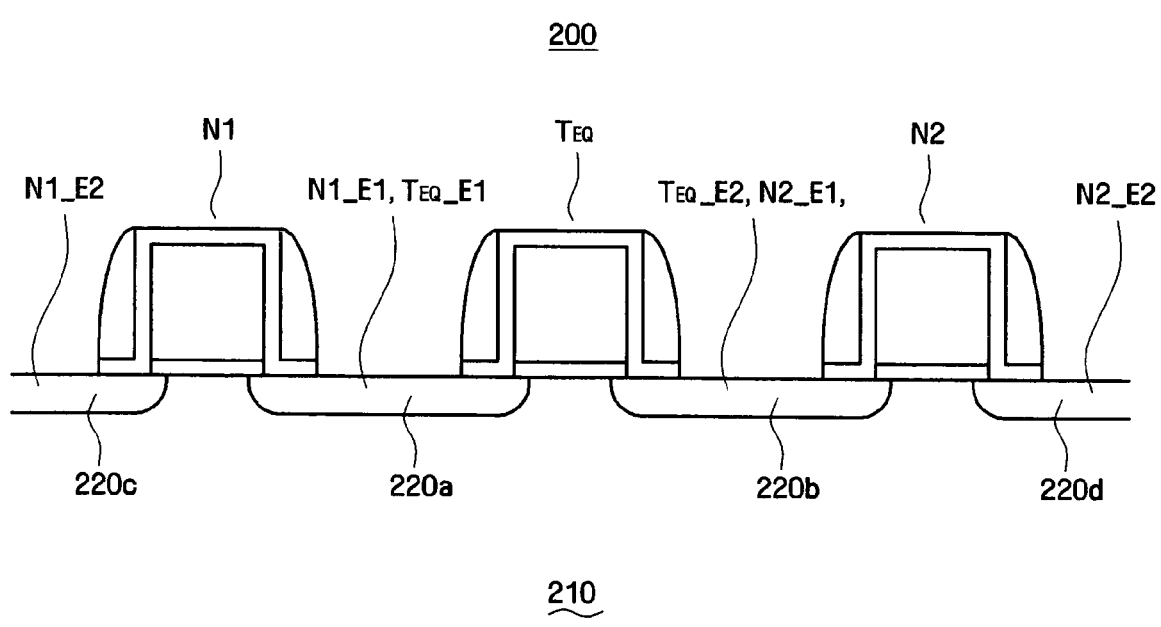
FIG. 3A is a diagram illustrating an example embodiment of a sense amplifier in which transistors in a transistor circuit and equalizing transistors share junction regions.
Figure 3B:
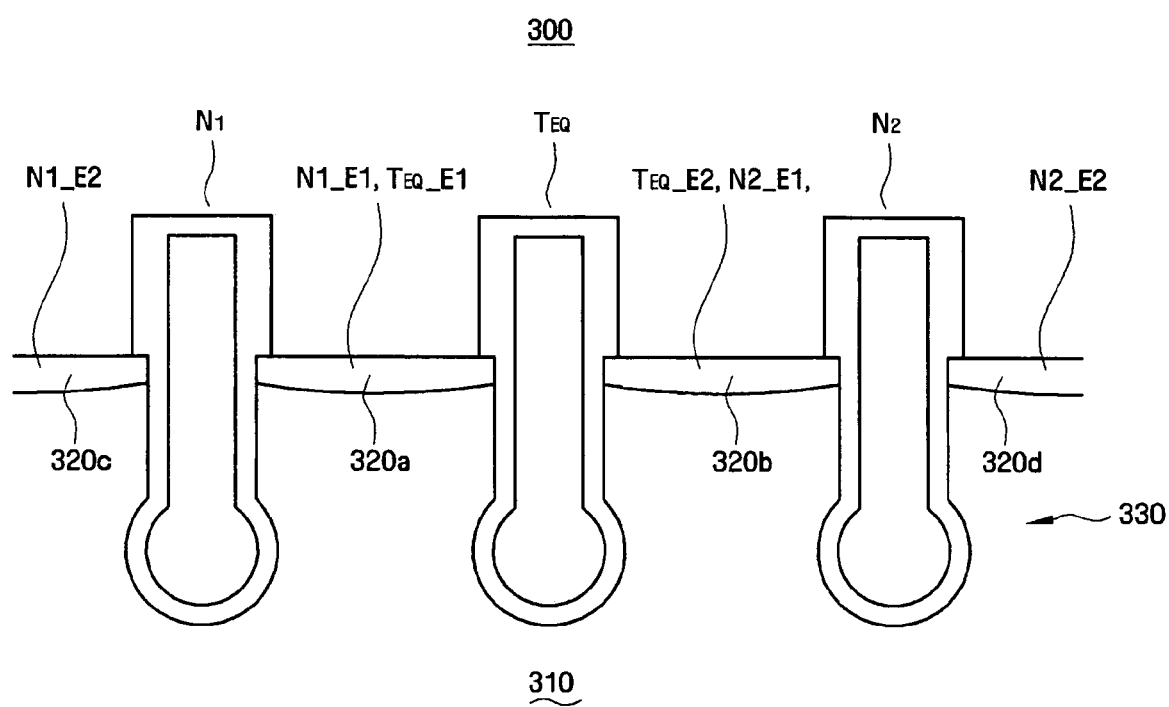
FIG. 3B is a diagram illustrating an example embodiment of a sense amplifier in which channel regions of the transistors in a transistor circuit and an equalizing transistor each are formed of a recessed channel array transistor (RCAT)

FIG. 3A is a diagram illustrating an example embodiment of a sense amplifier in which transistors (e.g., NMOS transistors) N1, N2 and equalizing transistors share junction regions with each other. FIG. 3B is a cross-sectional view taken along the line I-II of FIG. 2A.

Referring to FIG. 3A, in a sense amplifier 200, a first electrode of a first transistor N1_E1 and a first electrode of an equalizing transistor $T_{EQ}$_E1 may share a second junction region 220a with each other.

In sense amplifiers according to at least this example embodiment, because the transistors N1, N2 and $T_{EQ}$ may share junction regions with each other, the gate electrodes N1_G, N2_G, and $T_{EQ}$_G may be arranged at specific locations such that they appear in parallel with one another.

The other junction regions 220c and 220d may be a second electrode of the first transistor N1_E2 or an internal ground voltage electrode $V_{ssA}$. Alternatively, the other junction regions 220c and 220d may be a second electrode of the second transistor N2_E2 or the internal ground voltage electrode $V_{ssA}$.

FIG. 3B is a diagram illustrating an example embodiment of a sense amplifier in which channel regions of transistors N1 and N2 and an equalizing transistor $T_{EQ}$ are formed of a recessed channel array transistor (RCAT).

Referring to FIG. 3B, the sense amplifier 300 may include the transistors N1, N2, and $T_{EQ}$. Each of the transistors N1, N2, and $T_{EQ}$ may include a RCAT 330.

When implementing sense amplifiers according to example embodiments, a short channel effect may occur. If such a short channel effect occurs, the short channel effect may be suppressed using a RCAT.

In at least this example embodiment, because sizes of the patterns are set to various values, specific values need not be discussed. Accordingly, the description of the sizes of the transistors having the RCAT structure described with reference to FIG. 3B will be omitted for the sake of brevity. However, those skilled in the art will understand that the specifications of the recessed channel array transistors may be determined according to the sizes and/or intervals of the transistors and/or the applied voltage and current.

Figure 4:
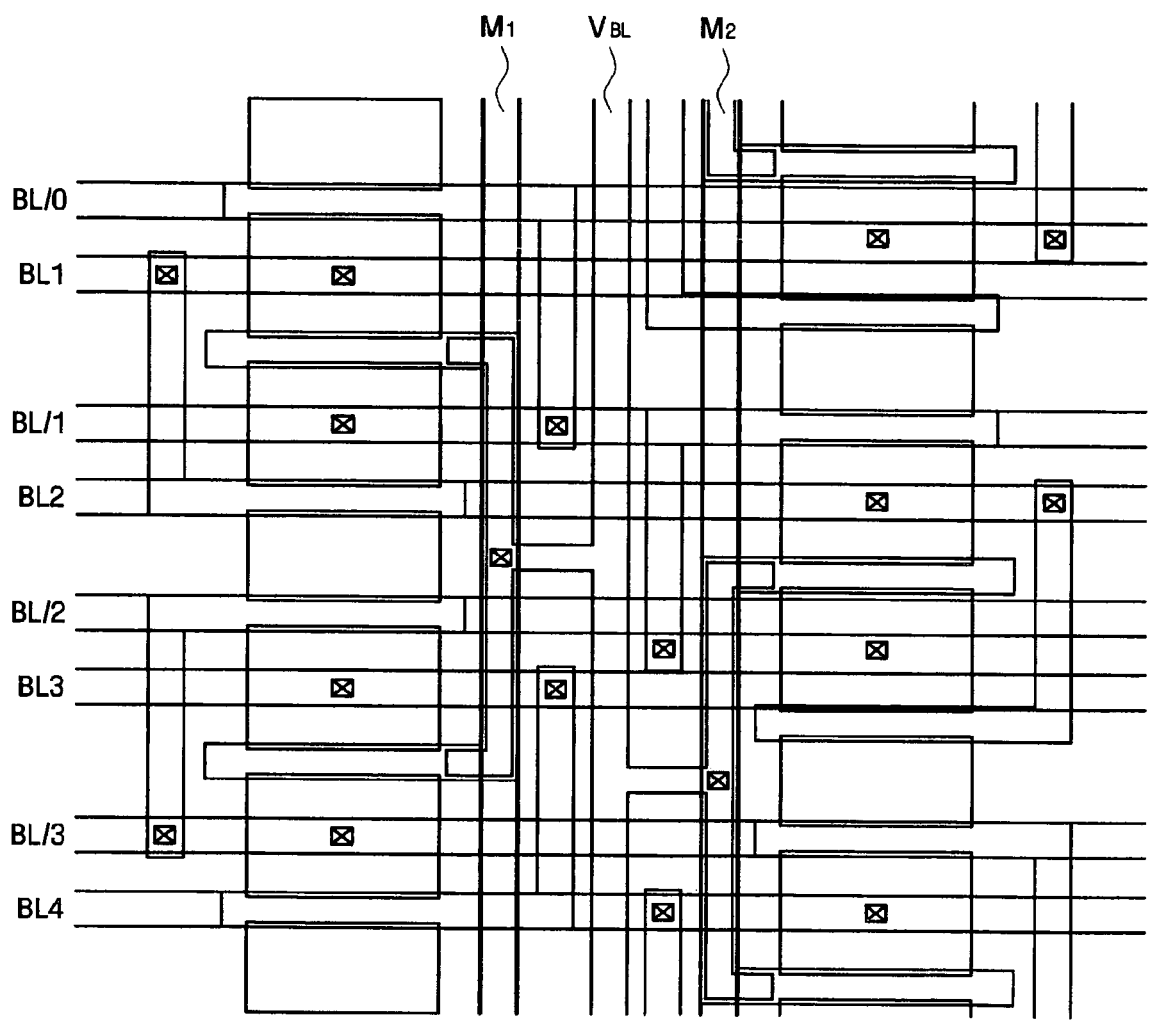
FIG. 4 is a diagram illustrating an example layout of a sense amplifier unit according to another example embodiment.

FIG. 4 is a diagram illustrating an example layout of a sense amplifier according to another example embodiment.

Referring to FIG. 4, when further reduction of area occupied by the sense amplifier in a horizontal direction and/or increased operating speed as in the equalizing command signal $P_{EQ}$ is necessary, separate signal transmission lines M1 and M2 may be formed. The separate signal transmission lines M1 and M2 may be, for example, metal or silicide, which may have improved conductivity. A signal may be applied to a contact plug or a via plug through the signal transmission lines M1 and M2. In at least this example embodiment, the signal transmission lines M1 and M2 may be formed at heights different from the height of the gate electrode of the equalizing transistor $T_{EQ}$_G. For example, the gate electrode of the equalizing transistor $T_{EQ}$_G may be formed adjacent to the substrate. The signal transmission lines M1 and M2 may be formed at locations higher than the gate electrode of the equalizing transistor $T_{EQ}$_G, and may be electrically connected to the gate electrode of the equalizing transistor $T_{EQ}$_G using, for example, the contact plug or the via plug.

For the sake of clarity, an example in which the signal transmission lines M1 and M2 transmit the equalizing command signal $P_{EQ}$ will be explained.

Referring still to FIG. 4, because the equalizing command signal $P_{EQ}$ may be applied to one side of the sense amplifier, the area occupied by the sense amplifier may be reduced. Furthermore, lower resistance and/or faster response time may be achieved because the signal transmission path of the equalizing command signal $P_{EQ}$ may have a linear shape.

According to example embodiments, in the layout and the vertical structure of the sense amplifiers, gate electrodes of the transistors (e.g., NMOS transistors) and equalizing transistors may be disposed in parallel. As a result, the area occupied by the sense amplifiers may be reduced and/or the operational speed of the sense amplifiers may be increased.

Although example embodiments have been described, it will be apparent to those skilled in the art that various modifications and changes may be made thereto without departing from the scope and spirit of the present invention. Therefore, it should be understood that the above embodiments are not limitative, but illustrative in all aspects.

What is claimed is:

1. A sense amplifier comprising:
a first transistor having a gate electrode electrically connected to a bit line and a first electrode electrically connected to a complementary bit line;
a second transistor having a gate electrode electrically connected to the complementary bit line and a first electrode electrically connected to the bit line; and
an equalizing transistor arranged between the gate electrode of the first transistor and the gate electrode of the second transistor, a first electrode of the equalizing transistor being electrically connected to the first electrode of the first transistor, and a second electrode of the equalizing transistor being electrically connected to the first electrode of the second transistor.

2. The sense amplifier of claim 1, wherein at least one of the gate electrodes of the first transistor and the second transistor is formed in an L shape.

3. The sense amplifier of claim 1, wherein the first electrode of the first transistor and the first electrode of the equalizing transistor share a junction region.

4. The sense amplifier of claim 1, wherein the first electrode of the second transistor and the second electrode of the equalizing transistor share a junction region.

5. The sense amplifier of claim 1, wherein at least one of the first transistor, the second transistor and the equalizing transistor is a recessed channel array transistor (RCAT).

6. A semiconductor device comprising:
a sense amplifier unit, the sense amplifier unit including a plurality of the sense amplifiers of claim 1.

7. The semiconductor device of claim 6, wherein each of the plurality of sense amplifiers further includes,
an equalizing command signal line through which an equalizing command signal is applied to the gate electrode of the equalizing transistor, the equalizing transistor electrically connecting the bit line and the complementary bit line in response to the equalizing command signal.

8. The semiconductor device of claim 6, wherein, in each of the plurality of sense amplifiers, the second electrode of the first transistor and the first electrode of the second transistor are electrically connected to a ground voltage node.

9. The semiconductor device of claim 8, wherein the ground voltage node is an area of a substrate including n-type ions.

10. The semiconductor device of claim 6, wherein an equalizing command signal is applied to the gate electrode of the equalizing transistor to electrically connect the bit line and the complementary bit line.

11. The semiconductor device of claim 6, further including, a pre-charge voltage electrode electrically connected to the bit line and the complementary bit line in response to the equalizing command signal.

12. The semiconductor device of claim 11, wherein the pre-charge voltage electrode is an area of the substrate including n-type ions.

13. The semiconductor device of claim 11, wherein the pre-charge voltage electrode partially overlaps a signal line through which the equalizing command signal is transmitted.

14. The semiconductor device of claim 13, wherein the pre-charge voltage electrode does not overlap the gate electrode of the equalizing transistors.

15. The semiconductor device of claim 6, wherein, in each of the plurality of sense amplifiers, the first transistor and the second transistor are symmetrical to each other with the equalizing transistor interposed there between.

16. The semiconductor device of claim 6, wherein, in each of the plurality of sense amplifiers, the gate electrodes of the first transistor and the second transistor are formed in an L shape.

17. The semiconductor device of claim 6, wherein, in each of the plurality of sense amplifiers, the first electrode of the first transistor and the first electrode of the equalizing transistor share a first junction region.

18. The semiconductor device of claim 17, wherein, in each of the plurality of sense amplifiers, the first electrode of the second transistor and the second electrode of the equalizing transistor share a second junction region.

19. The semiconductor device of claim 18, wherein the first and second junction regions are regions of the substrate including n-type ions.

20. The semiconductor device of claim 6, wherein at least one of the first transistor, the second transistor and the equalizing transistor of at least one sense amplifier is a recessed channel array transistor (RCAT).

21. The semiconductor device of claim 6, wherein the plurality of sense amplifiers are arranged such that the plurality of sense amplifiers are mirrored in vertical and horizontal directions.

22. The semiconductor device of claim 21, wherein each of the plurality of sense amplifiers further includes,
an equalizing command signal line through which an equalizing command signal is applied to the gate electrode of the equalizing transistor.

23. The semiconductor device of claim 21, wherein the equalizing command signal line is formed at the same height as the gate electrode of the equalizing transistor and is connected to each end of the gate electrode of the equalizing transistor in a vertical direction.

24. The semiconductor device of claim 21, wherein the equalizing command signal line is formed at a height different from a height of the gate electrode of the equalizing transistor and is electrically connected to the gate electrode of the equalizing transistor through a contact plug.

25. The semiconductor device of claim 24, wherein the equalizing command signal line is formed of a metal or silicide.

* * * * *